United States Patent [19]

Mikami

[11] 4,369,432

[45] Jan. 18, 1983

[54] AUTO-CALIBRATED D-A CONVERTER

[75] Inventor: Tsukasa Mikami, Gyoda, Japan

[73] Assignee: Takeda Riken Kogyo Kabushikikaisha, Tokyo, Japan

[21] Appl. No.: 119,843

[22] Filed: Feb. 8, 1980

[51] Int. Cl.³ .......................................... H03K 13/03
[52] U.S. Cl. ........................ 340/347 DA; 340/347 M; 340/347 CC
[58] Field of Search .................... 340/347 M, 347 DA

[56] References Cited

U.S. PATENT DOCUMENTS

| | | | |
|---|---|---|---|
| 2,718,634 | 9/1955 | Hansen | 340/347 DA |
| 3,064,887 | 11/1962 | Waters et al. | 340/347 DA |
| 3,254,337 | 5/1966 | Hunt | 340/347 DA |
| 4,107,670 | 8/1978 | Hornak | 340/347 DA |

OTHER PUBLICATIONS

Schmid, Electronic Analog/Digital Conversions, Van Nostrand Reinhold Co., 1970, pp. 206-211.

*Primary Examiner*—T. J. Sloyan
*Attorney, Agent, or Firm*—Staas & Halsey

[57] ABSTRACT

A plurality of code signal generators are provided, respectively corresponding to bits of a digital signal to be converted. Each of the code signal generators generates a pulse signal having a duty ratio corresponding to the weight of the corresponding bit of the digital signal. The pulse signal is smoothed to provide a DC output corresponding to the weight of the bit. The outputs from the code signal generators corresponding to the respective bits of the input digital signal are summed by a summing circuit to obtain an analog converted output.

11 Claims, 12 Drawing Figures

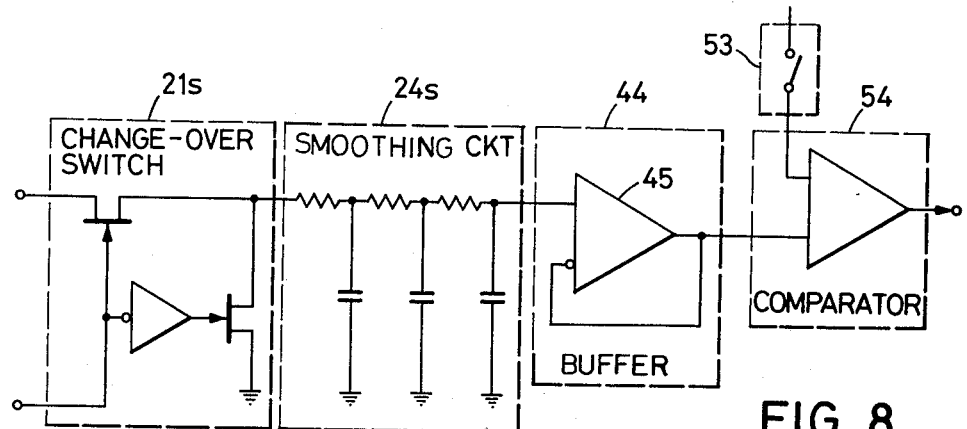
FIG. 8
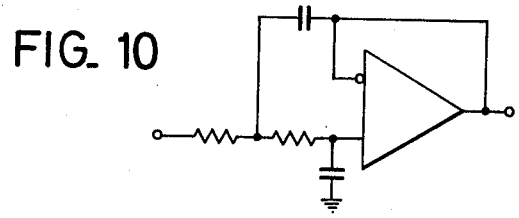
FIG. 10
FIG. 11
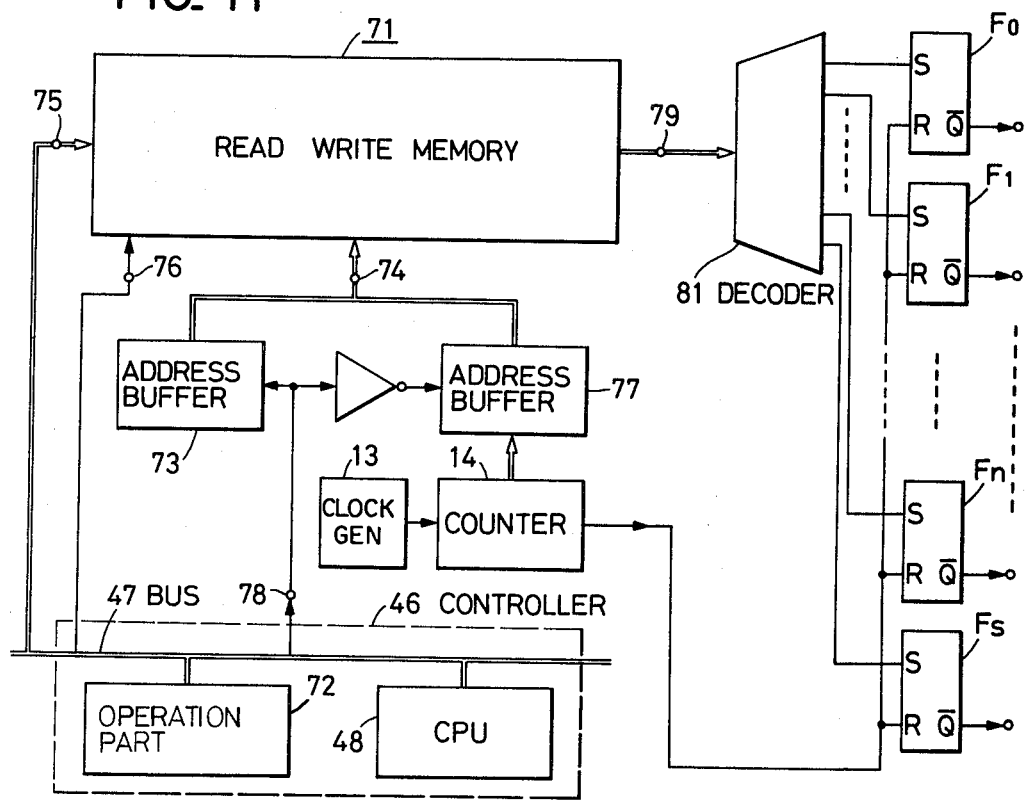

AUTO-CALIBRATED D-A CONVERTER

BACKGROUND OF THE INVENTION

This invention relates to a digital-to-analog converter (hereinafter referred to as a D-A converter) which provides an analog signal by adding together DC signals, each corresponding to the weight of one of digits of a digital input. More particularly, the invention pertains to a D-A converter which is capable of converting a digital input of many digits into analog form with high accuracy.

In a D-A converter widely employed in the past, use is made of various resistors for the purpose of voltage division, shunting, addition, amplification or like operations, but the accuracy of conversion is influenced by the accuracy of the resistance value of each resistor. To lessen such influence, a winding resistor which has a small temperature coefficient and which is pre-adjusted to have high accuracy is used; however, the winding resistor is bulky, hence is an obstacle to the reduction of the overall size of the converter and is not suitable for fabrication as an integrated circuit. From the viewpoint of integration, it is preferred to employ a thin film resistance element as the resistor, but such a resistance element has a large temperature coefficient and requires special equipment for adjustment of its resistance value.

Another conventional D-A converter is of the type that converts a digital signal to the duty ratio of a pulse signal and renders the converted output into a DC voltage to obtain an analog output. In this case, a clock signal is used for the conversion into the duty ratio and it is easy to obtain a clock signal which is highly accurate in period and highly stable with respect to temperature, etc. For rendering the converted signal into a DC signal, however, use is made of a smoothing circuit which causes a time lag in operation and hence makes high-speed operation possible.

SUMMARY OF THE INVENTION

It is an object of this invention to provide a D-A converter which does not require adjustment of resistances with high accuracy but is capable of high-speed conversion and insusceptible to the influence of ageing variations and ambient temperature.

Another object of this invention is to provide a D-A converter which permits ready compensation for variations in a reference voltage, ageing or the like, thereby ensuring correct conversion.

Another object of this invention is to provide a D-A converter in which the influence of variations in a reference voltage, the offset of an amplifier, resistance values of resistors and so on can be corrected periodically and/or automatically when required, thus ensuring that a stable and highly accurate D-A conversion is performed.

Yet another object of this invention is to provide a D-A converter which, when combined with an existing D-A converter, for example, a commercially available one, is capable of effecting a D-A conversion involving a larger number of conversion bits than that of existing converters and hence is highly accurate.

In accordance with the present invention, there are provided a plurality of code signal generators, each having a reference voltage and a common potential which are selectively changed over by a switch and each having an output which is smoothed by a smoothing circuit. Each code signal generator differs from others in its switching ratio which is selected so that the smoothed DC output may be a predetermined output corresponding to the weight of a corresponding one of the bits of a digital input signal to be converted. In other words, in each code signal generator, the reference voltage is converted into a pulse signal of a predetermined duty ratio and is then rendered into a DC signal. Accordingly, the code signal generator can be arranged so as to be free from the influence of ambient temperature or ageing variations. In the manner described above, the DC signals, each corresponding to one bit of each input digital signal, are derived from the code signal generators, and the signals are each output by controlling an output switch with the corresponding bit signal of the input digital signal. The signals thus taken out are summed by a summing circuit to obtain a converted analog output. The outputs from the code signal generators may be in the form of either currents or voltages.

A control circuit for controlling the change-over switch in each code signal generator is arranged so that the duty ratio of a control signal for changing over the change-over switch is determined by a set value which can be altered by setting means. For example, the above-mentioned DC signal is derived from a selected one of the code signal generators, and this output is displayed on an accurate voltmeter or current meter, preferably a digital meter, and the set value of the setting means is gradually varied so that the displayed output may be brought into agreement with a predetermined correct value. Accordingly, variations in the overall characteristics of, for example, a current converter used in the case of obtaining the current output from each code signal generator, the offset of the current converter and the summing circuit for summing the outputs from the respective code signal generators can be easily adjusted by changing the change-over ratio of the switch, that is, the duty ratio of the control signal. In addition, the value thus adjusted does not readily vary. By similarly adjusting the set value of the setting means for each code signal generator, it is possible to obtain a correct converted output as a whole, and in this case, deviations occurring at respective parts of the various circuits can also be corrected.

Such adjustment of each code signal generator can also be performed automatically. For example, for each code signal generator, a reference value generator is provided, which generates a reference value peculiar to the output from the particular code signal generator. With this reference value generator, for example, the duty ratio of a square wave signal which assumes a reference potential and a common potential alternately, is varied according to the desired reference value, and the square wave signal is smoothed, whereby a correct reference value which is unaffected by temperature changes of resistance elements used, can be obtained. The output from one of the code signal generators and the reference value corresponding thereto are compared by a comparator, and in accordance with the comparison result, the set value for the code generator is adjusted so that both inputs to the comparator may be brought into agreement with each other. Such control can be achieved through the use of a microcomputer.

Namely, in dependence on whether the output from the comparator is high or low in level, 1 is added to or subtracted from the least significant bit of the setting means for the code signal generator selected by the microcomputer, i.e. a register having stored therein the set value for the code signal generator. Then, the comparison is effected again, and the same operation is repeated until both inputs to the comparator become coincident with each other. This adjustment is carried out for each code signal generator, and once this adjustment has been effected for all of the code signal generators, a command may also be issued manually for conducting this comparison and adjustment periodically or at an appropriate time.

Also, it is possible to convert a digital signal having a larger number of digits than those in the prior art into an analog signal by combining a plurality of code signal generators with a conventional D-A converter which obtains the weight corresponding to each bit of the digital input signal by a resistance circuit. In this case, a plurality of higher order bits of the input signal are each assigned to one of the code signal generators, the remaining lower order bits being applied to the prior art D-A converter, and the respective bit outputs are added together.

BRIEF DESCRIPTION OF THE DRAWINGS

FIG. 8 is a circuit diagram of a specific operative example of a reference signal generator 43 for use in this invention;

FIG. 10 is a circuit diagram of an example of an active filter employed in a smoothing circuit 24 for use in this invention;

FIG. 11 is a block diagram of a modified form of this invention in which one part of a control circuit 23 is used in common by each code signal generator through utilization of a memory.

DESCRIPTION OF THE PREFERRED EMBODIMENTS

Figure 1:
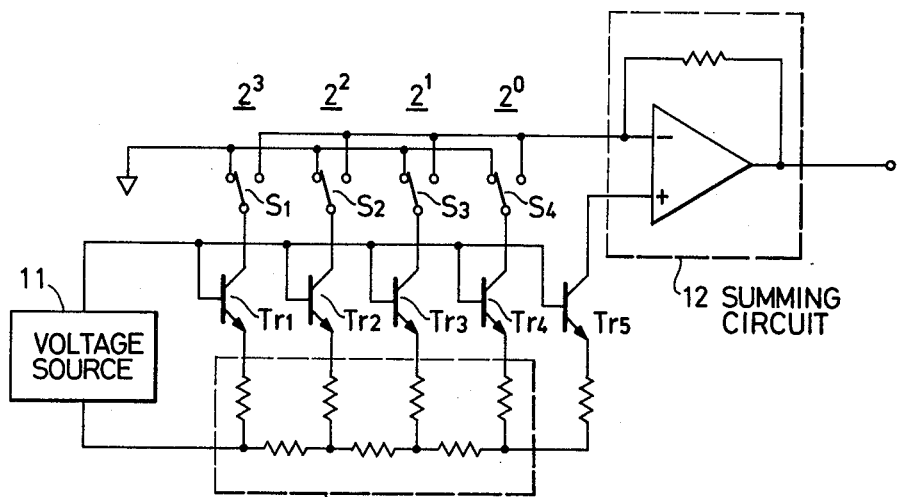
FIG. 1 is a circuit diagram of a conventional D-A converter which obtains weight signals using resistance circuits.

To facilitate a better understanding of the present invention, a description will be given first of conventional D-A converters. FIG. 1 shows a conventional type of D-A converter in which the weight corresponding to each bit of an input signal is determined by a resistance circuit. A constant voltage is provided from one end of a voltage source 11 to the bases of transistors $Tr_1$ to $Tr_5$. The emitters of the transistors $Tr_1$ and $Tr_4$ are each connected to one end of each branching resistor of a ladder resistor circuit 10 which is, in turn, connected to the other end of the voltage source 11. The collectors of the transistors $Tr_1$ to $Tr_4$ are grounded or connected to one input side of a summing circuit 12 via change-over switches $S_1$ to $S_4$ which are each provided for a corresponding one of the bits of an input digital signal, and operate on each bit signal thereof. The switch $S_1$ is controlled by the most significant bit of the input digital signal and the switch $S_4$ is controlled by the least significant bit. In this case, the resistance values of the resistors respectively connected to the emitters of the transistors $Tr_1$ to $Tr_5$ are all selected, for example, to be 2R, whereas the resistance values of the resistors connected between the other ends of the abovementioned resistors are selected to be R. The transistor $Tr_5$ has its emitter connected via a resistor to the end of the ladder resistor circuit 10 opposite the voltage source 11, and has its collector connected to the other input side of the summing circuit 12.

By setting the resistance values of the resistors correctly, currents respectively corresponding to the weights of digital inputs to the switches $S_1$ to $S_4$ are summed by the summing circuit 12. For obtaining accurate resistance values for the resistors, the prior art employs, as such resistors, for example, winding resistors having small temperature coefficients, but in this case, it is necessary to adjust the resistance value of each resistor with high accuracy. The winding resistor is bulky and hence is not preferred for fabrication as an integrated circuit. Instead, in integrated circuits, use is made of thin film resistance elements. However, the thin film resistance element is not preferred since its temperature coefficient is large, and to adjust its resistance value with accuracy, the thin film resistance element is subjected to what is called laser trimming. In particular, one part of the thin film resistance element is removed by laser to adjust its resistance to a desired one. This adjustment involves the use of special equipment and requires much time. In addition, during the laser trimming, the thin film resistance element is exposed to a high temperature and applied stress, so that its resistance value is not retained stably for a long period of time and is likely to vary with the lapse of time.

In such a converter as shown in FIG. 1, each resistance element must be adjusted to have an accurate resistance value, and the resistance element of the summing circuit 12 must also be adjusted to have a predetermined resistance value. Accordingly, in the case of converting an input digital signal having a number of bits, the resistance values required for the high-order bits must be extremely accurate; this imposes a limitation on the number of digital input bits which can be converted.

Furthermore, in the conventional converter shown in FIG. 1, the magnitude of the output analog signal is affected by variations in the reference voltage of the voltage source 11. The reference voltage is usually obtained through utilization of a constant voltage available from a Zener diode, but since the voltage from the Zener diode undergoes substantial changes, the reference voltage must be adjusted, and this adjustment requires a resistance element, whose resistance value must therefore be adjusted with accuracy. The offset of an operational amplifier used in the summing circuit 12 also exerts influence on the output. It is very difficult to adjust the resistance value of each resistance element with accuracy, as described above, and such adjustment has its limits; furthermore, what is more important is that in order to maintain an accurate conversion the accurate resistance value must not be changed by the influence of ambient temperature. In the prior art, however, it is difficult to obtain such a highly accurate and stable resistance element and the resistance inevitably varies with the lapse of time, resulting in the defect of degraded conversion accuracy.

As described above, since the prior art D-A converter shown in FIG. 1 is adapted to perform weighting by the resistance circuit 10, it is necessary to correct the resistance value of each resistance element of the resistance circuit. In order to accurately convert an input digital signal into an analog signal without being affected by the resistance values of the resistance elements used, there has been proposed a D-A converter of the type that converts the input digital signal to the duty ratio of a pulse signal and renders the converted output into a DC signal to provide an analog output.

Figure 2:
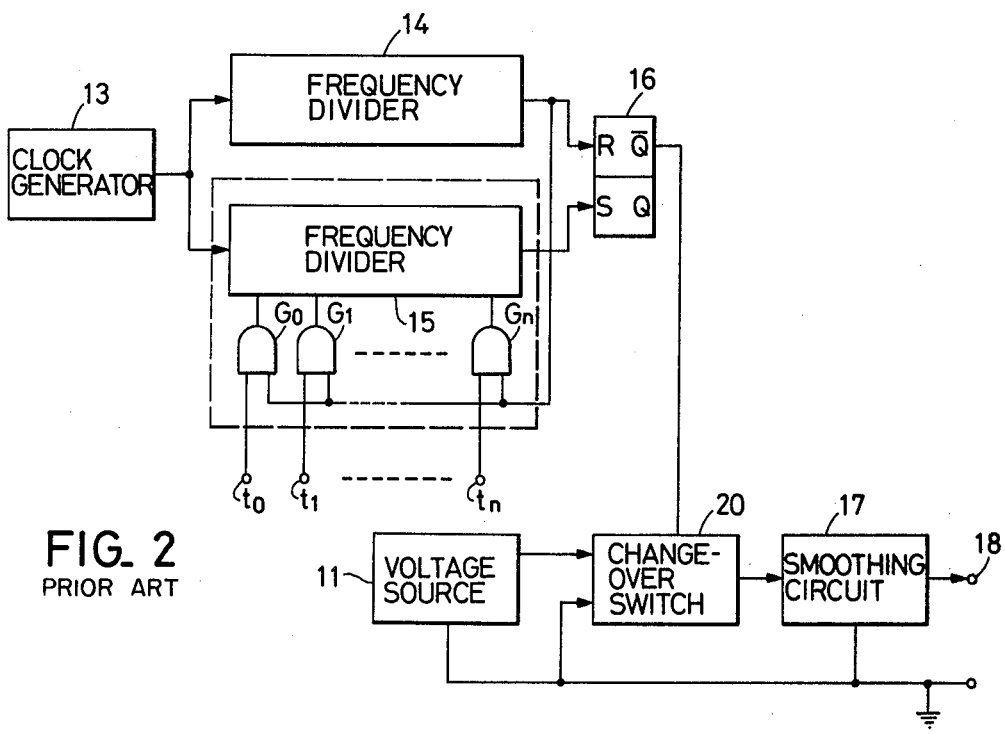
FIG. 2 is a block diagram of a prior art D-A converter of the type that changes the duty ratio of a pulse signal of a constant period in accordance with an input digital signal and provides its smoothed output as an analog output.

As depicted in FIG. 2, clock pulses from a clock generator 13 are frequency divided by frequency dividers 14 and 15, each formed by a counter. Upon each counting of a certain number of clock pulses by the frequency divider 14, the contents of terminals $t_0$ to $t_n$ which are supplied with respective bit signals of an input digital signal are preset by the output from the frequency divider 14 in the frequency divider 15 via gates $G_0$ to $G_n$ respectively. A flip-flop 16 is reset by the frequency-divided output from the frequency divider 14 and set by the output from the frequency divider 15. The frequency dividing ratios or maximum count values of the frequency dividers 14 and 15 are selected to be equal.

Figure 3:
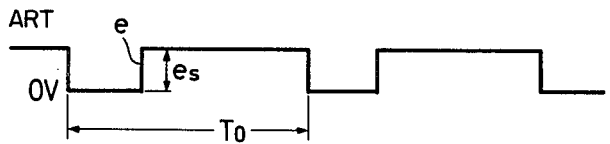
FIG. 3 is a waveform diagram for illustrating the operation of the converter shown in FIG. 2.

Consequently, the Q output from the flip-flop 16 becomes low-level when the frequency divider 14 yields an output. When the value set in the frequency divider 15, i.e. the input digital signal, is large, the output generation from the frequency divider 15 is early, whereas when the input digital signal is small, the output generation is retarded, and upon generation of the output from the frequency divider 15, the Q output from the flip-flop 16 becomes high-level. By the Q output from the flip-flop 16, a change-over switch 20 is controlled and while the Q output is high-level, the change-over switch 20 is connected to the constant voltage side of the voltage source 11, and while the Q output is low-level, the switch 20 is connected to the common potential side of the voltage source 11. Accordingly, the change-over switch 20 provides such an output as shown in FIG. 3 and its period $T_0$ is the output period of the frequency divider 14 and constant. However, the high-level period is proportional to the magnitude of the input digital signal set at the terminals $t_0$ to $t_n$. Therefore, by smoothing the output from the change-over switch 20 with a smoothing circuit 17, an analog output proportional to the input digital signal is derived at an output terminal 18.

Such a D-A converter performs digital processing of the input digital signal and does not require the resistance value adjustment. Further, the D-A conversion is not affected by ambient temperature variations and ageing; namely, if the clock period of the clock generator 13 and the reference voltage source 11 are both constant, the other parts are not influenced by temperature and ageing, thereby ensuring a D-A conversion having high stability and accuracy.

With this conventional D-A converter of the type converting the input digital signal to the duty ratio of a pulse signal, however, pulses must be smoothed by the smoothing circuit 17 to obtain a converted output. This inevitably causes a time lag, making it difficult to obtain a converted output sufficiently following up a rapidly changing digital signal.

Figure 4:
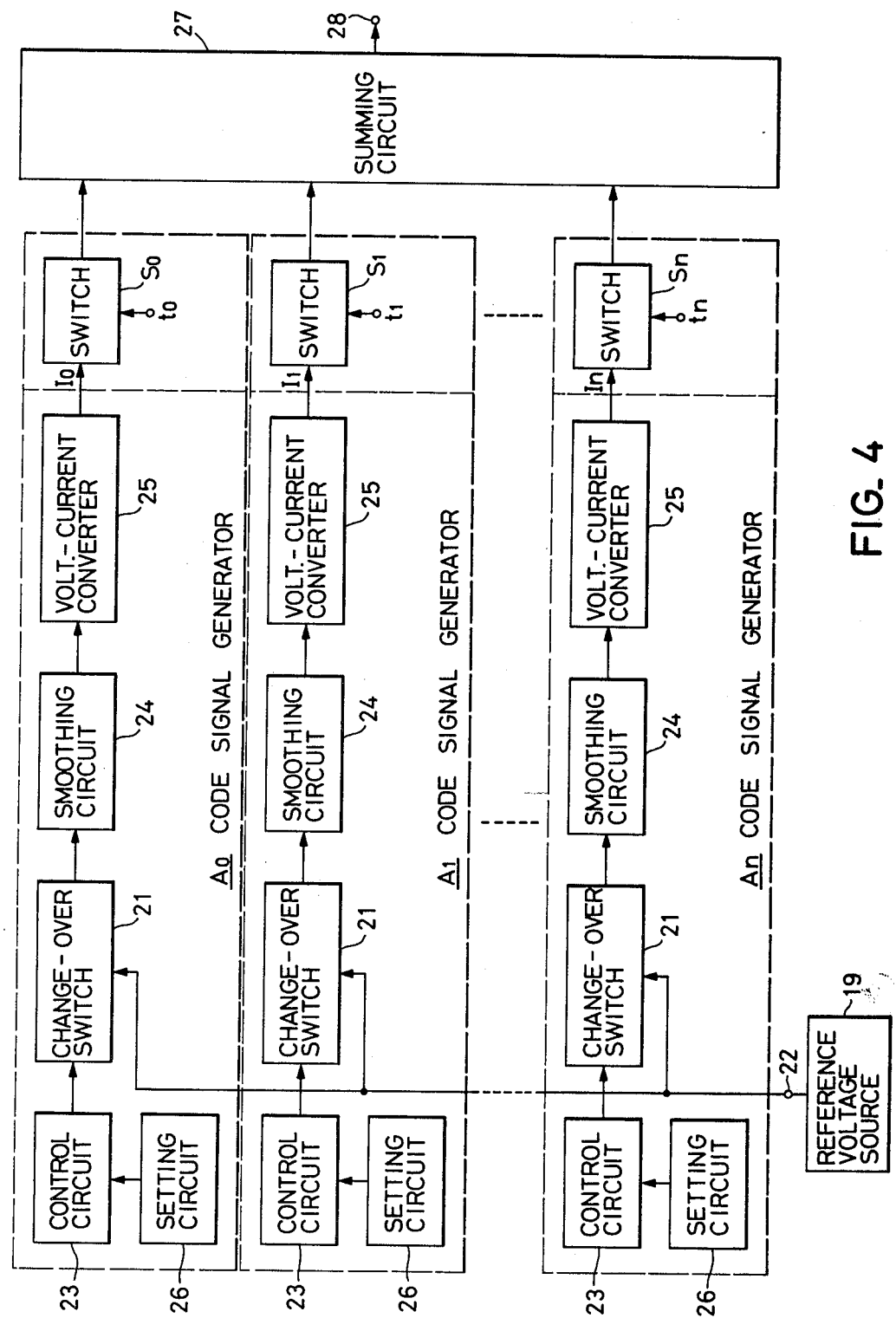
FIG. 4 is a block diagram, of an embodiment of the D-A converter of this invention.

FIG. 4 illustrates an embodiment of the D-A converter of this invention. In the present invention, code signal generators $A_0$ to $A_n$ are provided, in each of which there is provided a change-over switch 21 which is changed over between a common reference power source terminal 22 supplied with a reference voltage from a reference voltage source 19 and a common potential point. The change-over switch 21 is controlled by a control circuit 23, and the output from the change-over switch 21 is rendered by a smoothing circuit 24 into a DC voltage. In the illustrated embodiment, the DC output is a DC voltage but it is converted by a voltage-current converter 25 to a current. The DC currents $I_0$ to $I_n$ thus converted are each selected to have the magnitude of a weight corresponding to one of bits of the input digital signal; namely, the currents $I_0$ to $I_n$ are respectively given magnitudes proportional to the weights $2^0, 2^1, \ldots 2^n$.

In order to obtain the outputs respectively corresponding to such weights, the change-over ratios of the switches 21 are made different for each of the code signal generators $A_0$ to $A_n$. The switch 21 is changed over the control circuit 23 between the constant voltage terminal 22 and the common potential point, as described above. The control circuit 23 yields a control signal of a duty ratio corresponding to a set value of a setting circuit 26 provided for each code signal generator. During the low-level period of the control signal, the change-over switch 21 is connected to the common potential point, and during the high-level period of the control signal, the change-over switch 21 is connected to the power source terminal 22. The control circuit 23 may be identical in construction, for example, with the arrangement for obtaining the signal for controlling the change-over switch 20 in FIG. 2. In other words, the control circuit 23 comprises the frequency dividers 14 and 15 and the flip-flop 16 used in FIG. 2, and the clock pulses to the frequency dividers can be applied in common to the code signal generators. In the setting circuit 26 there is set a digital signal which corresponds to the weight of the bit.

The DC signals $I_0$ to $I_n$ obtained in the code signal generators $A_0$ to $A_n$ are respectively provided to output switches $S_0$ to $S_n$. From each of control terminals $t_0$ to $t_n$ of the output switches $S_0$ to $S_n$ a corresponding bit signal of the input digital signal is supplied to the corresponding output switch; namely, a first bit signal of the input digital signal is applied to the terminal $t_0$, a second bit signal is applied to the terminal $t_1, \ldots$ and the most significant bit signal is applied to the terminal $t_n$. When the bit signal is "1", the output switch corresponding to the bit signal is turned ON to permit the passage there-through of the output DC signal from the code signal generator connected thereto.

The outputs from the output switches $S_0$ to $S_n$ are summed up by a summing circuit 27. In the summing circuit 27, the summed current is converted to a voltage as required, providing a converted analog output at an output terminal 28.

Figure 5:
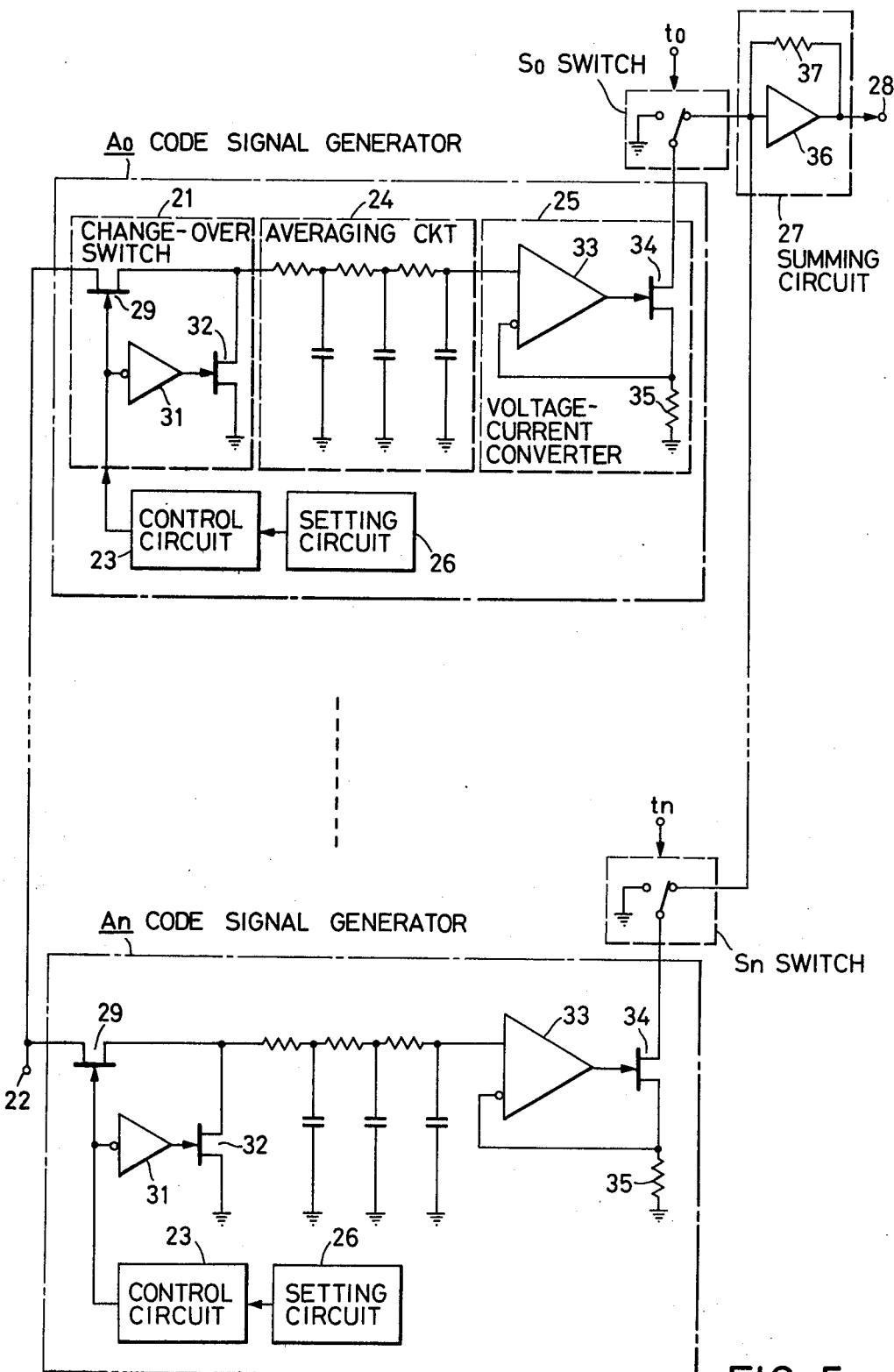
FIG. 5 is a circuit diagram showing a specific operative example of one part of the converter depicted in FIG. 4.

With reference to FIG. 5, a specific operative example of the code signal generator will be described. The following description will be given of the code signal generator $A_0$, but the other code signal generators are identical in construction with the code signal generator $A_0$. As the control circuit 23, use can be made of the example shown in FIG. 2, and the control circuit 23 provides the control signal having the duty ratio corresponding to the value set in the setting circuit 26. The control signal is supplied directly to the gate of an FET switch 29 in the change-over switch 21. When the control signal is high-level, the FET switch 29 is turned ON to pass on the reference voltage from the terminal 22 to the smoothing circuit 24. In the case of the output from the control circuit 23 being low-level, however, it is inverted by an inverter 31 and then provided to the gate of an FET switch 32, and the output from the FET switch 29 is connected via the FET switch 32 to the common potential point. As a consequence, the potential at the common potential point is applied to the smoothing circuit 24.

The duty ratio of the output from the control circuit 23 differs with the code signal generators $A_0$ to $A_n$, as mentioned previously. In this example, the respective control signals are of the same period, but the high-level pulse widths of the outputs from the control circuits 23 of the code signal generators $A_1$ to $A_n$ are respectively $2^1, 2^2, \ldots 2^n$ times as large as the pulse width of the high level of the output from the control circuit 23 of the code signal generator $A_0$.

The smoothing circuit 24 is shown in FIG. 5 to be formed, for example, by an RC filter composed of a plurality of cascade-connected RC low-pass filter stages, each comprising a resistor and a shunt capacitor. If the so-called active filter such, for example, as shown in FIG. 10 which comprises an operational amplifier, resistance elements and capacitance elements is used as the smoothing circuit 24, it would be convenient for fabrication as an integrated circuit.

In the voltage-current converter 25, an operational amplifier 33 is provided, which is supplied at its non-inverted input side with the smoothed output voltage from the smoothing ciircuit 24. The output from the operational amplifier 33 is applied to the gate of a FET 34. The FET 34 has its source connected via a resistor 35 to the common potential point and its drain connected to a moving element of the output switch $S_0$. When the input to the terminal $t_0$ is "1", the output switch $S_0$ connects the drain of the FET 34 to the side of the summing circuit 27 and when the input is "0", the switch $S_0$ connects the drain of the FET 34 to the common potential point. The source of the FET 34 is connected to an inverted input side of the operational amplifier 33 and a source current flows in the FET 34 so that both inputs to the operational amplifier 33 may agree to each other; namely, there is obtained a current corresponding to the input voltage of the operational amplifier 34.

When the output switch $S_0$ is being controlled, i.e., when the signal of the first bit of the input digital signal is "1", the drain of the FET 34 is connected to the side of the summing circuit 27 to permit a current flow to the FET 34, and this current is provided, for instance, to an operational amplifier 36 of the summing circuit 27. To the input side of the operational amplifier 36 are also connected, via the output switches $S_1$ to $S_n$, the drains of the FET's 34 of the converters 25 in the other code signal generators $A_1$ to $A_n$, respectively.

In each of the code signal generators $A_0$ to $A_n$, since the duty ratio of the control signal from the control circuit 23 between the high and low level in the constant period $T_0$ corresponds to the weight of the corresponding bit of the input digital signal, as described above, the output voltage from the smoothing circuit 24, in which the output from the switch 21 is smoothed, corresponds to the above-mentioned weight and the current output converted from the smoothed output also corresponds to such weight. By controlling the output switches $S_0$ to $S_n$ with the input digital signals corresponding thereto, there is obtained, in the summing circuit 27, an analog output corresponding to the input digital signal.

In each of the code signal generators $A_0$ to $A_n$, the current of the weight of the corresponding bit of the input digital signal is yielded by the voltage-current converter 25, and even if high-speed switches are used as the output switches $S_0$ to $S_n$, the voltage-current converters 25 can sufficiently respond to such high-speed switches. Moreover, the smoothing circuit 24 always yields its smoothed output, so that the output is not affected by the time constant of the smoothing circuit 24 and quickly responds to variations in the digital input, enabling conversion of even a rapidly changing digital signal.

Further, the voltage-current converter 25 and the summing circuit 27 employ resistors, i.e. resistors 35 and 37 in FIG. 5, and their resistance values exert influence on the outputs from the circuits 25 and 27; however, these resistance values need not be adjusted. That is, prior to its actual use, the D-A converter is adjusted for each signal generator in the following manner. For example, the output switch $S_0$ corresponding to the code signal generator $A_0$ is connected to the summing circuit 27 and the change-over ratio of the switch 21 is adjusted by changing the set value in the setting circuit 26 to bring the converted output at that time, i.e. the output at the terminal 28 into agreement with a correct value while observing the output, for example, on a digital voltmeter. The setting circuit 26 may be, for instance, a digital switch, which is adjusted manually. It is also possible to employ a register as the setting circuit 26 and to control it by applying thereto a setting signal from the outside. With the above operation, it is possible to correct all initial errors such as dispersion in each resistance value, offset of the operational amplifier, variations in the reference voltage applied to the terminal 22 and so forth.

The above adjustment takes place for each code signal generator. Thereafter, such adjustment is performed, as required, in response to ageing and ambient temperature variations; for example, in the case where it is likely that the resistance value deviates from its predetermined value so as to cause a conversion error, an output is applied to the output terminal of each code signal generator $A_0$-$A_n$ and to determine whether or not it has a predetermined value. If the output deviates from the predetermined value, the above-mentioned adjustment is carried out using the setting circuit 26.

Thus, the D-A converter of this invention does not involve any adjustment of the resistance value of the resistors used. For precise adjustment of a film resistance element, for example, laser trimming is needed, which necessitates the use of special, expensive equipment and requires much trouble; however, the present invention eliminates the necessity of such cumbersome adjustments. Moreover, in the laser trimming of the film resistance element, the resistance film is exposed to a high temperature and distorted, so that the resistance element becomes less stable. In the present invention, however, since no such adjustment is involved, the resistance element retains its stability. Furthermore, the respective parts, especially, the control circuit 23 etc., can be formed by a digital circuit, hence are excellent in stability. This facilitates fabrication of the D-A converter as an integrated circuit.

The code signal generators $A_0$ to $A_n$ are adapted to produce outputs which respectively correspond to the weights of the corresponding bits of the input digital signal and which are given the values $2^0, 2^1, 2^2, 2^3, \ldots 2^n$, as described previously. However, it is also possible to provide one code signal generator which yields the output $2^0$ and a plurality of code signal generators each of which produces the output $2^2$. The point is to obtain outputs respectivly corresponding to the weights of the bits of the input digital signal.

Further, when the voltage-current converter 25 is provided, as described previously with regard to FIG. 5, the current flowing in the resistor 35 has a value equal to the output voltage from the smoothing circuit 24 divided by the resistance value of the resistor 35, and this current is provided as the output current from the code signal generator. In particular, the output voltage from the smoothing circuit 24 corresponds to the weight of the corresponding bit of the input digital signal; hence, the output current also corresponds to that weight.

As will be appreciated from the above, it is possible to obtain an output current corresponding to the above-mentioned weight by fixing the change-over ratios of the switches 21 and changing the resistance values of the resistors 35 in the voltage-current converters 25 of the code signal generators $A_0$ to $A_n$ in correspondence to the weights of the respective bits of the input digital signal, so that the outputs from all of the smoothing circuits 24 of the code signal generators $A_0$ to $A_n$ may be constant. In this case, it is necessary to adjust the resistance value of the resistor 35 so that a current of a predetermined magnitude may be obtained. However, as described previously, by adjusting the set value of the setting circuit 26, fine control of the resistor 35 can be omitted, and consequently the weight can also be determined easily by the resistance value of the resistor 35. In this case, if a film resistance elements are used as the resistors 35, then it is preferred to use film resistance elements manufactured by the same process. The voltage-current converter 25 and the summing circuit 27 are not limited specifically to those employed in the example of FIG. 5.

Figure 6:
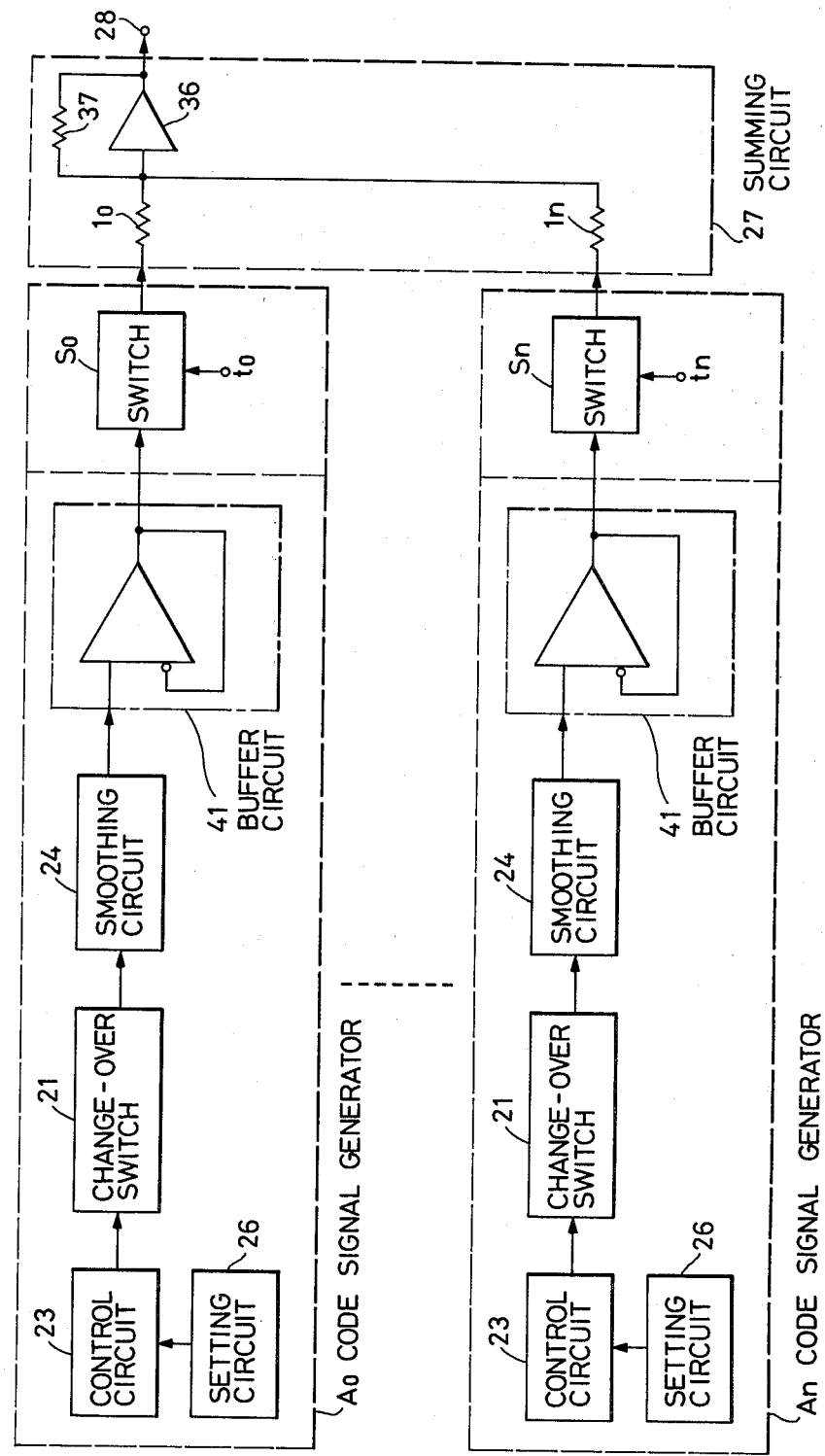
FIG. 6 is a block diagram of another embodiment of the D-A converter of this invention, in which the outputs from respective code signal generators are derived as voltages.

It is also possible to obtain the outputs from the code signal generators $A_0$ to $A_n$ as voltages. As shown in FIG. 6 in which parts corresponding to those in FIG. 4 are identified by the same reference numerals, the output of the smoothing circuit 24 in each of the code signal generators $A_0$ to $A_n$ is converted by a buffer circuit 41 into a low impedance, which is provided to the output switch S. The outputs from the output switches $S_0$ to $S_n$ are added together by the summing circuit 27. That is, the output switches $S_0$ to $S_n$ are respectively connected via resistors $l_0$ to $l_n$ to the input side of the operational amplifier 36. The summing gain of the summing circuit 27 is given by a ratio between the resistance value of a feedback resistor 37 and the resistance value of the corresponding input resistor, for example, the resistance value of the resistor $l_1$, and this gain can be selected suitable for amplification. It is also possible that the gain of the buffer circuit 41 is not 1 but is selected suitable in combination with the summing gain of the summing circuit 27. Also, it is possible to omit the buffer circuit 41 and supply the outputs from the smoothing circuits 24 to the output switches $S_0$ to $S_n$, respectively. In this case, the input resistors $l_0$ to $l_n$ are also left out, and as the resistor of the summing circuit 27, the resistor of each smoothing circuit 24 can be utilized. In general, since the output resistance value of the smoothing circuit 24 is relatively large, the gain of the summing circuit 27 is reduced.

Figure 7:
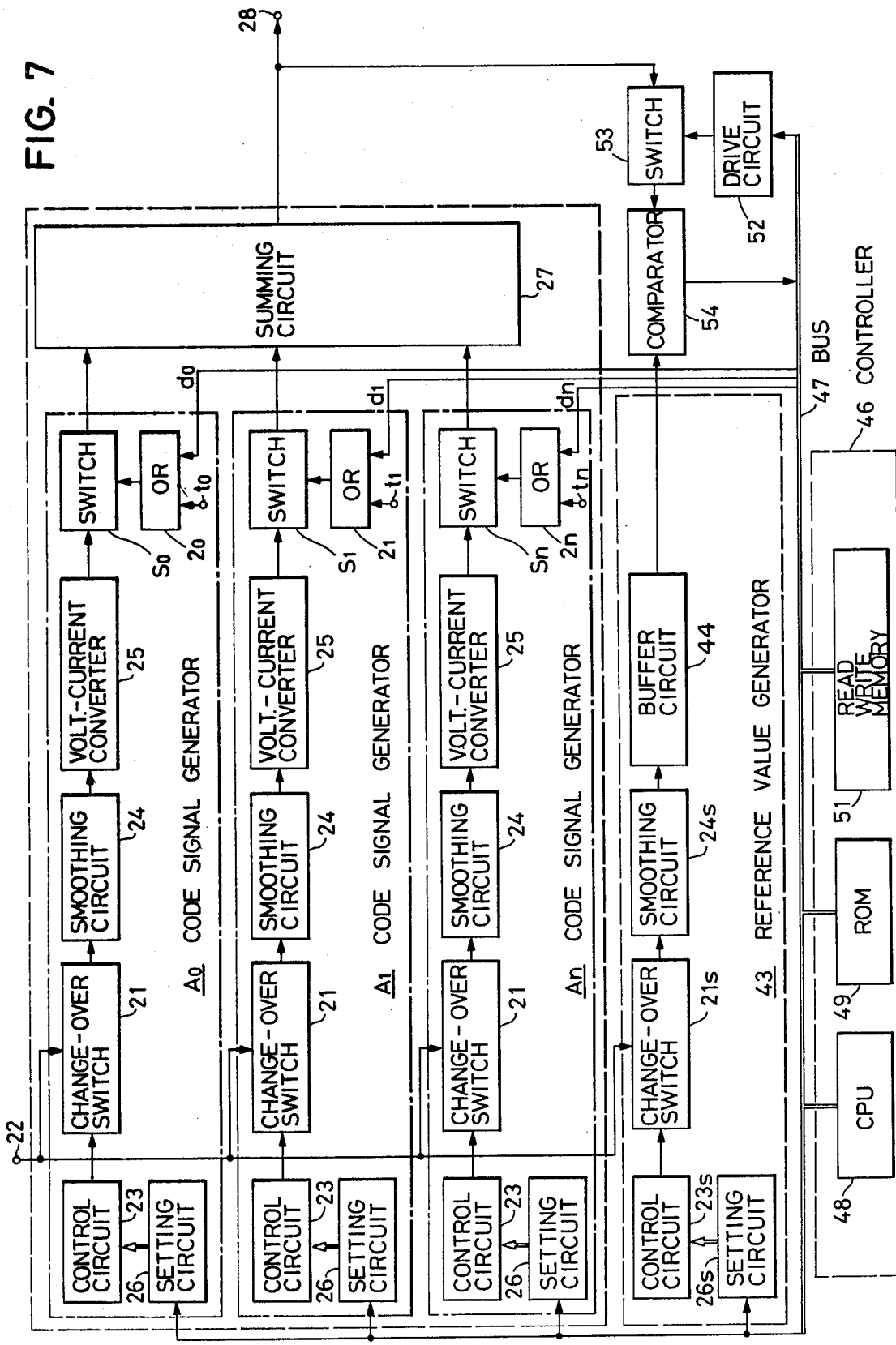
FIG. 7 is a block diagram of another embodiment of the D-A converter of this invention which is equipped with the function of automatically calibrating the output from each code signal generator.

It is necessary to calibrate the DC signals from the code signal generators $A_0$ to $A_n$ so that they have predetermined levels. This can also be carried out automatically. To this end, a reference value generator 43 is provided, for example, as shown in FIG. 7 in which parts corresponding to those in FIG. 4 are identified by the same reference numerals. The reference value generator 43 is capable of producing reference values having the weight which is generated by each of the code signal generators $A_0$ to $A_n$, and in addition, the reference value generator 43 is able to yield at all times a stable value which is not affected by, for example, a resistance value. For instance, in the present example, the reference value generator 43 is adapted to produce a signal having a duty ratio corresponding to each reference value and to render it into a DC signal, and is arranged to be substantially indentical in construction with the code signal generators $A_0$ to $A_n$. That is, a changeover switch $21s$ is controlled by a control circuit $23s$ to be switched between the reference potential at the terminal 22 and the common potential, and the output from the switch $21s$ is rendered, by a smoothing circuit $24s$, into a DC signal which is provided to a buffer circuit 44. The buffer circuit 44 does not require any resistance element having a highly accurate resistance value, so that it is possible to employ, for example, such a circuit arrangement as shown in FIG. 8, in which the output from an operational amplifier 45 is fed back directly to the inverted input thereof. In particular, in the case where the output from the operational amplifier 45 is voltage divided by resistors and fed back to the input thereof, the output is affected by variations in the resistance values of the voltage dividing resistors; but, if such resistors are not used, as shown in FIG. 8, the circuit arrangement is free from such a defect.

In FIG. 7, a setting circuit $26s$ is also provided which yields the set value for determining the duty ratio of the output from the control circuit $23s$. In the setting circuit $26s$, the set value is rewritten under the control of a controller 46. The set value is preselected so as to obtain the reference value of the output from each of the code signal generators $A_0$ to $A_n$. The controller 46 can be formed by, for example, a microcomputer, and its bus 47 is connected to a central processing unit 48, a read only memory 49 having stored therein a program and various parameters and a read/write memory 51. In the read only memory 49 there are stored ideal set values respectively corresponding to the weights of the code signal generators $A_0$ to $A_n$, and when calibrating the output from each code signal generator, the set value corresponding thereto is read out from the read only memory 49 and set in the setting circuit 26s, thereby deriving an ideal reference value from the reference signal generator 43.

At the same time, a drive circuit 52 is driven by the controller 46 to turn ON a switch 53, through which the signal derived at the converted output terminal 28 is applied to one input side of a comparator 54, to the other input side of which is provided the reference value from the reference value generator 43. Further, for selecting one of the code signal generators $A_0$ to $A_n$ to be calibrated, one of the output switches $S_0$ to $S_n$ is controlled via command lines $d_0$ to $d_n$ from the controller 46 and OR circuits $2_0$ to $2_n$. It is the same as in the case of FIG. 4 that the output switches $S_0$ to $S_n$ are controlled via the OR circuits $2_0$ to $2_n$ by the bit signals respectively corresponding to the digital signals from the terminals $t_0$ to $t_n$. In FIG. 7, it is illustrated that control commands are applied directly to the drive circuit 52 and the command lines $d_0$ to $d_n$, but in practice, they are controlled via an input/output control circuit as is the case with an ordinary microcomputer.

In this way, one of the code signal generators, for example, $A_0$ is selected, and only the output switch $S_0$ is controlled, with the other output switches $S_1$ to $S_n$ remaining uncontrolled. At the same time, the setting circuit 26s of the reference value generator 43 is set to provide an ideal value which ought to be derived at the output terminal 28 when the output from the code signal generator $A_0$ alone is supplied to the output terminal 28. Consequently, the reference value generator 43 yields the reference value for the code signal generator $A_0$. The converted output provided at the output terminal 28, (i.e., the converted output from the code signal generator $A_0$) is supplied via the switch 53 to a comparator 54, in which it is compared with the reference value produced by the reference value generator 43. The output from the comparator 54 is checked by the central processing unit 48 of the controller 46 to determine whether it is high or low in level, and according to the check result, 1 is added to or subtracted from the set value for the setting circuit 26 of the code signal generator $A_0$. This process is repeated until both inputs to the comparator 54 agree with each other. In other words, the control is repeated until the converted output from the code signal generator $A_0$ becomes equal to the reference value.

After such calibration of the output from the code signal generator $A_0$, the next code signal generator $A_1$ is selected and its output alone is provided to the output terminal 28; at the same time, in order to obtain the reference value for the output from the code signal generator $A_1$, the set value of the setting circuit 26s is changed under the control of the central processing unit 48. In the manner described above, the set value of the setting circuit of each code signal generator is automatically adjusted so that the output from each code signal generator will have its correct reference value.

The setting of the setting circuit 26s may also be effected by reading out the setting value itself from the read only memory 49 and setting it in the setting circuit 26s. Also, it is possible to prestore in the setting circuit 26s a plurality of set values corresponding to the code signal generators $A_0$ to $A_n$ and select and apply one of the set values to the control circuit 23s under the control of the controller 46. The controller 46 may be constructed so that the operation for calibrating the output value of the code signal generator to the reference value may take place periodically. Also, it is possible to apply a calibration start command to the controller 46, for example, manually as required, or to employ such an arrangement that upon turning ON of a power source switch of the D-A converter, the calibration is automatically carried out.

In the reference value generator 43, when the set value of the setting circuit 26s is changed, it takes some time to obtain a correct reference value corresponding to the set value due to the presence of the smoothing circuit 24s. In particular, there occurs a time lag corresponding to the time constant of the smoothing circuit 24s. But this problem can be overcome by calibrating each code signal generator when the D-A converter is out of operation or just prior to its operation. The calibration need not be high-speed, and accordingly, the reference value generator 43 is capable of providing the reference value with very high accuracy. It is also possible to employ, as the reference value generator 43, some other circuit arrangements capable of stably producing reference values with high accuracy. Further, the controller 46 need not always be formed by a microcomputer but may also be constituted entirely by hardware.

In the manner described above, the output from each code signal generator can be readily calibrated, so that it is not affected by variations in the reference voltage, caused by, for example, replacement of the Zener diode of the reference voltage source, variations in the resistance value in the voltage-current converter 25, ageing and so forth. Accordingly, the converted output can be obtained with high accuracy at all times. Further, the reference value generator 43 can also be readily integrated.

It is also possible to combine the above-mentioned D-A conversion, using the code signal generators, with the conventional D-A conversion using resistance weighting circuits. In this case, the conventional type of D-A conversion is employed for lower order bits of the input digital signal, whereas the D-A conversion using the code signal generators is performed for higher order bits of the input signal.

Figure 9:
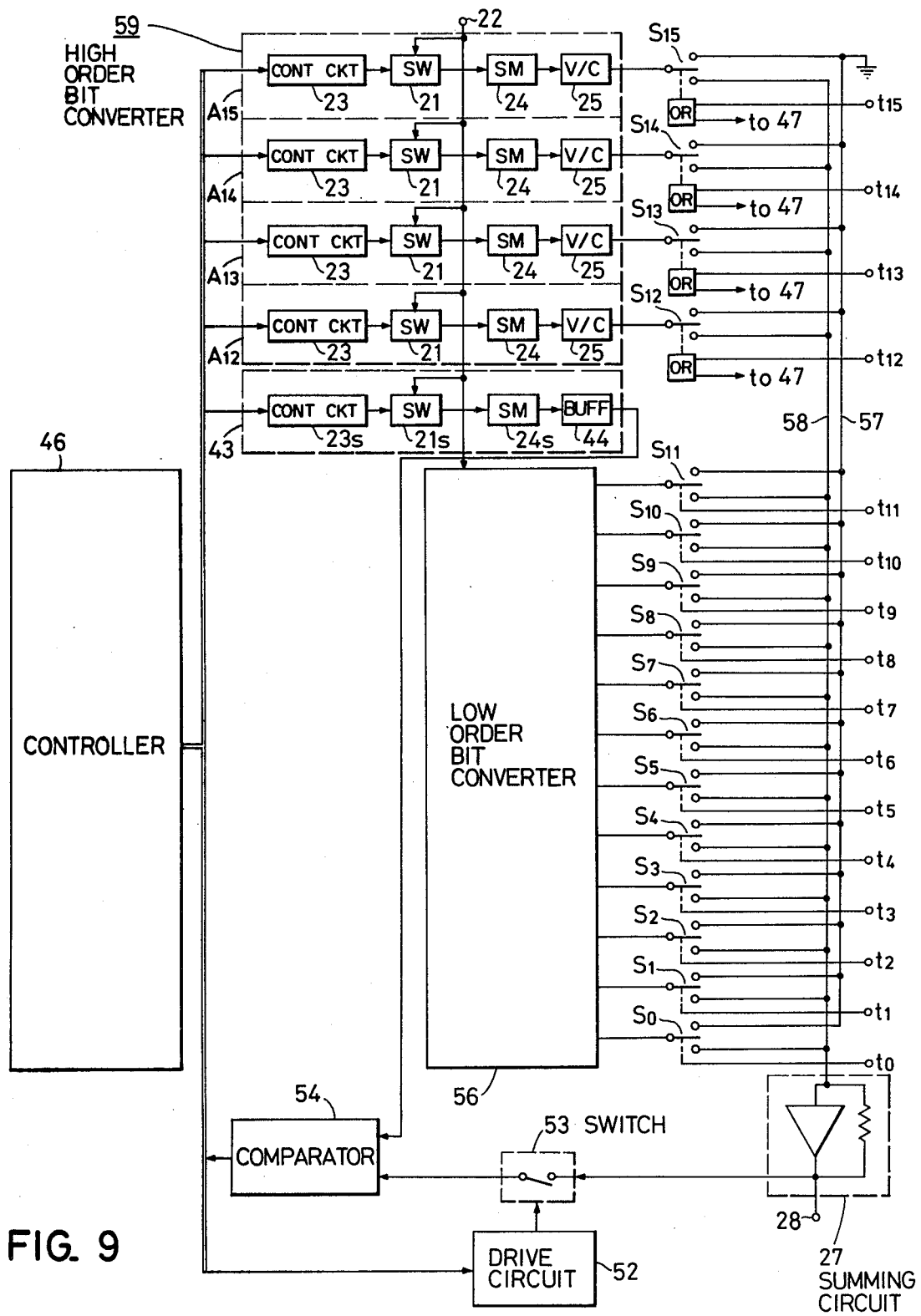
FIG. 9 is a block diagram of another embodiment of the D-A converter of this invention employing, in combination, a conventional type of D-A converter part and a D-A converter utilizing code signal generators.

For example, as shown in FIG. 9 in which parts corresponding to those in FIG. 7 are identified by the same reference numerals, a lower order bit conversion unit 56 is provided for obtaining signals corresponding to the weights of digital signals to be converted by resistance circuits. The conversion accuracy depends on the resistance value of each resistance element. The lower order bit conversion unit 56 may be of the same arrangement as the circuit depicted in FIG. 1, and as the reference voltage of the reference voltage source 11, use is made of the reference voltage from the terminal 22, and as the summing circuit 12, use is made of the summing circuit 27. The switches $S_0$ to $S_{11}$ connected to the collectors of the transistors $Tr_1$, $Tr_2$, . . . are respectively switched between a line 57 on the side of the common potential point and a line 58 on the side of the summing circuit 27 under the control of signals from those $t_0$ to $t_{11}$ of terminals $t_0$ to $t_{15}$ which are respectively supplied with lower order bits of the input digital signal. The switches $S_0$ to $S_{11}$ are controlled by the lower order bits of the input digital signal and the outputs from the lower order bit converter 56 are added together by the summing circuit 27, thus effecting the conversion for the lower order bits of the input digital signal.

Four code signal generators $A_{12}$ to $A_{15}$ are provided respectively corresponding to the higher order bits of the input signal which are applied to the terminals $t_{12}$ to $t_{15}$. The outputs of the code signal generators $A_{12}$ to $A_{15}$ are selectively connected to the line 57 or 58 through switches $S_{12}$ to $S_{15}$ which are controlled by those signals from the terminals $t_{12}$ to $t_{15}$ which respectively correspond to the higher order bits of the input signal. The illustrated embodiment is designed for automatic calibration as is the case with FIG. 7, and the reference value generator 43 is also provided. The code signal generators $A_{12}$ to $A_{15}$ make up a higher order bit converter 59. By the higher order bit converter 59, the converted outputs for the four higher order bits of the input digital signal are provided to the summing circuit 27 for conversion into analog form.

In order words, the bit signals of the input digital signal respectively control the switches $S_0$ to $S_{15}$ and the respective bit outputs from the lower and higher order bit converters 56 and 59 are added together by the summing circuit 27 to derive at the terminal 28 an output converted as a whole. In the case where only the output terminal of the summing circuit 12 is led out as an output terminal from the lower order bit converter 56, as described previously in connection with FIG. 1, the output from the summing circuit 12 is applied to the summing circuit 27.

With such an arrangement as shown in FIG. 9, the lower order bit converter 56 can be formed by a commercially available one and need not be adjusted so strictly as by laser trimming or the like. Even if the accuracy of the output from the converter 56 is low, the permitted value of changes in the converted output with respect to its magnitude is relatively large in terms of percentage, since the converted output is for the lower order bits of the input signal; therefore, the converter 56 can be formed easily and at low cost. In connection with the higher order bits, however, the absolute value of the converted output is large; therefore, its permitted value of changes is very small in terms of percentage. The higher order bit converter 59 can be made highly accurate by an arrangement in which code signal generators are provided in a manner to derive therefrom signals corresponding to the weights of the respective bits of the input signal, and such outputs are taken out using digital signals, as described previously. As a result, it is possible to easily perform the conversion of, for example, a 16-bit digital input which has heretofore been regarded as difficult to effect.

In FIG. 4, one part of the control circuit 23 of each of the code signal generators $A_0$ to $A_n$ may also be formed in common to them. This will hereinbelow be described with reference to FIG. 11. A read/write memory 71 is provided, and its addresses between the least and the most significant address are coordinated to the period To (corresponding to that shown in FIG. 3) of the control signal for controlling each change-over switch 21. The time resolution of the duty ratio is determined by the lowest order bit of setting circuit 26 and corresponds to one address in the read/write memory 71. That is, there are provided the same number of addresses in the read/write memory 71 as the number obtained by dividing the period To by the width of the duty ratio variation given by changing the lowest order bit of the setting circuit 26 by "1". The time position at the point of rise (or fall) of the control signal in the period To corresponds to an address between the least and the most significant address. In other words, the time space and the address space are coordinated with each other. Accordingly, the time position of rise (or fall) in the period To, of the control signal of each of the code signal generators $A_0$ to $A_n$, has a fixed value as described previously, and the address of the memory corresponding to that time position is determined. The data indicating the code signal generator is stored at this address. As described previously, the duty ratio of the control signal is determined by the set value of the setting circuit 26 for the control circuit 23. Consequently, the set value of the setting circuit 26 and the address of the memory 71 can be coordinated to each other. Therefore, by manipulating a keyboard or like operation part 72 provided in the controller 46, the address corresponding to the set value is applied via an address buffer 73 to an address terminal 74 of the memory 71. At the same time, data representing the code signal generator corresponding to the address is provided to a data terminal 75 of the memory 71 and a write command is applied to a read/write control terminal 76 of the memory 71 under the control of the central processing unit 48, thus writing the above-mentioned data in the memory 71. In this way, data representing the code signal generators $A_0$ to $A_n$ are stored in the memory 71 at the address positions corresponding to the duty ratios of the control signals to be produced.

In the meantime, a counter 14 is provided for counting the clock pulses from the clock generator 13, and the count content of the counter 14 is provided, via an address buffer 77, to the address terminal 74 of the memory 71. It is determined, by a command applied to a terminal 78 from the central processing unit 48, which one of the address buffers 73 and 77 is made valid. While the address buffer 77 is valid, the content of the counter 14 is applied to the terminal 74, and in this case, a read command is imparted to the terminal 76, so that the contents of the memory 71 at its respective addresses are read out therefrom successively. The period of the clock pulse from the clock generator 13 is determined so that the time necessary for reading out all the addresses of the memory 71 may be in agreement with the period To of the control signal. The data read out from the memory 71 is supplied via a terminal 79 to a decoder 81, wherein it is decoded to check which one of the code signal generators the data corresponds to. Flip-flops $F_0$ to $F_n$ are provided, respectively corresponding to the code signal generators $A_0$ to $A_n$, and respective output terminals of the decoder 81, at which outputs are yielded when the data representing the code signal generators $A_0$ to $A_n$ is decoded, are respectively connected to set terminals of the flip-flops $F_0$ to $F_n$. A reset terminal of each of the flip-flops $F_0$ to $F_n$ is connected to a terminal of the counter 14 at which an output is derived when the counter 14 counts a predetermined number, for example, a full-count number. For example, the larger the duty ratio of the control signal is, the higher-order the address position of the memory 71 for storing the data indicating the corresponding code signal generator becomes. The control signals for the code signal generators $A_0$ to $A_n$ are derived from the Q output terminals of the flip-flops $F_0$ to $F_n$. As described previously with respect to FIG. 5, calibration is performed by adjusting the duty ratio of the control signal in accordance with variations in the resistance values of the resistors 35 and 37 and offset of the operational amplifiers 33 and 36, while in case of FIG. 11, the calibration is performed by shifting the corresponding address position of the memory 71 where the data indicating the code signal generator is stored.

It is also possible to produce, by means of the memory 71, the control signal for the change-over switch 21s of the reference value generator 43 in FIG. 7. In such a case, when the central processing unit 48 selects one of the code signal generators $A_0$ to $A_n$ for which the calibration is to take place, the central processing unit 48 writes the data indicating the reference value generator 43 in the address position of the memory 71 corresponding to the duty ratio of the control signal which would be produced when the selected code signal generator is under ideal conditions. Further, the output terminal, at which the decoded output of the data indicating the reference value generator 43 is obtained, is connected to the set terminal of the flip-flop $F_S$, and the full-count output terminal of the counter 14 is connected to the reset terminal of the flip-flop $F_S$. By the $\overline{Q}$ output from the flip-flop $F_S$, the change-over switch 21s of the reference value generator 43 is controlled. In this case, if the data for the reference value generator 43 and the data for the code signal generator are of the same address position in the memory 71, the former is stored first and then the latter is stored at the next address. This does not present any problem since the number of addresses of the memory 71 is selected sufficiently large to obtain a high calibration accuracy. As the memory 71, use can also be made of one part of some other memory employed.

The control signal for the change-over switch 21 may be generated not only by the arrangements shown in FIGS. 2 and 11 but also by such an arrangement as follows: For example, a comparator is provided in each of the code signal generators $A_0$ to $A_n$, and the content of the counter 14 in FIG. 11 and the content of the setting circuit 26 in each code signal generator are compared by the above-mentioned comparator to detect coincidence between them, and then the coincidence output is applied to a flip-flop to set or reset it. The flip-flop is also reset or set by the full-count output from the counter 14. Further, various other arrangements can be employed.

Figure 12:
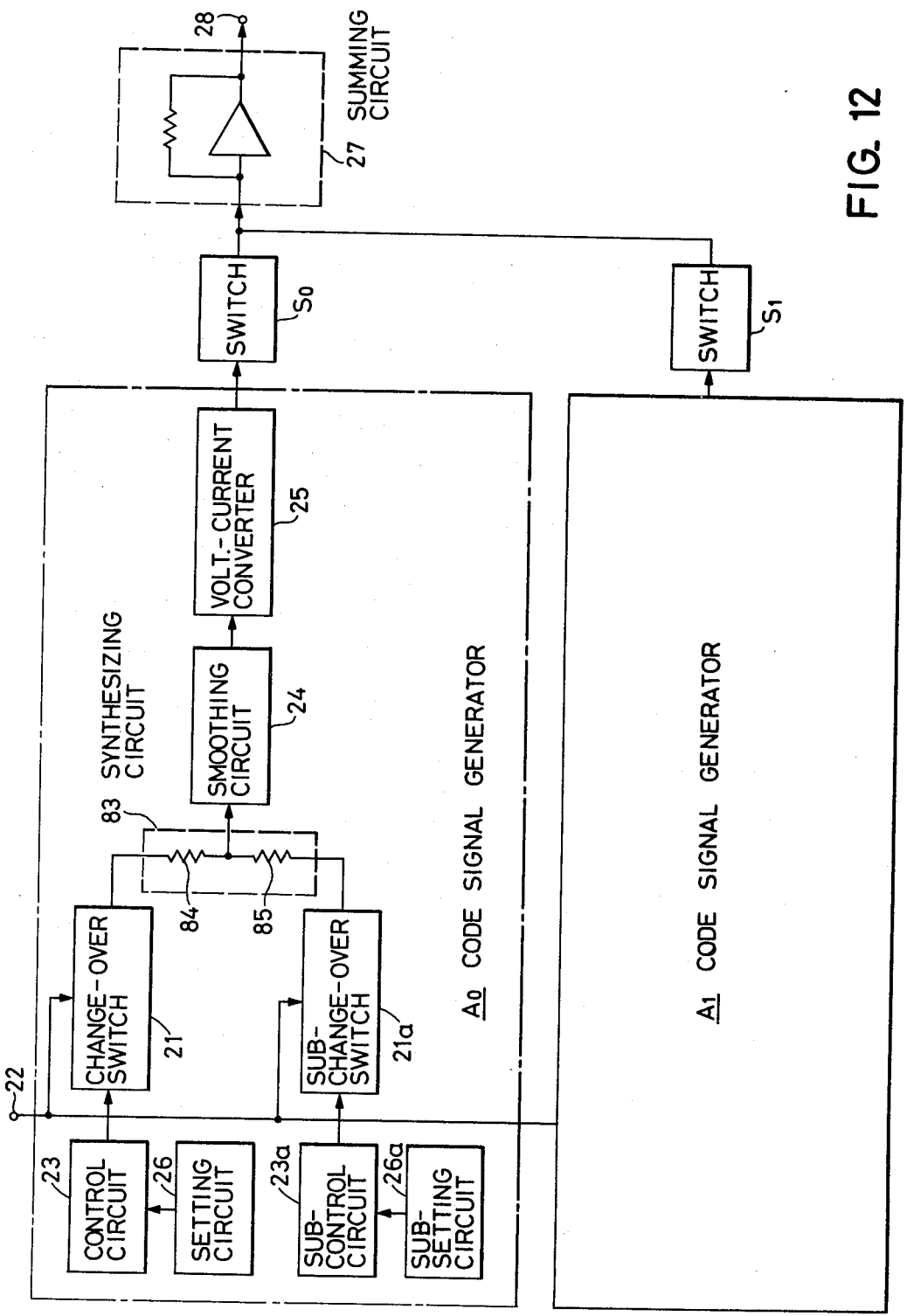
FIG. 12 is a block diagram of another modification of this invention in which the number of digits to be adjusted is increased by the use of a ratio combining circuit.

FIG. 12 illustrates an arrangement in which the full count value of the counter 14 is relatively small but the duty ratio of the control signal can be adjusted over a relatively large number of digits. For example, in the code signal generator $A_0$ there are provided, in addition to the change-over switch 21, the control circuit 23 and the setting circuit 26, a sub-change-over switch 21a, a sub-control circuit 23a for producing a control signal for controlling the sub-change-over switch 21a and a sub-setting circuit 26a for determining the duty ratio of the control signal. The outputs from the change-over switches 21 and 21a are combined by a synthesizing circuit 83 at a ratio of one or more digits in the decimal system into a composite output which is supplied to the smoothing circuit 24. In the synthesizing circuit 83, for example, resistors 84 and 85 of resistance values $R_1$ and $R_2$ are interconnected at one end, the connection point being connected to the input side of the smoothing circuit. The other ends of the resistors 84 and 85 are connected to the outputs of the change-over switches 21 and 21a, respectively. Letting the output voltages of the change-over switches 21 and 21a be represented by $E_0$ and $E_{0a}$ respectively, the output from the synthesizing circuit 83 is given as follows:

$$(R_1 E_0)/(R_1+R_2)+(R_2 E_{0a})/(R_1+R_2)$$

In this case, $R_1$ and $R_2$ are selected to be, for example, 1 K$\Omega$ and 1 M$\Omega$, respectively. Suppose by adjusting the change-over ratios of the change-over switches 21 and 21a, the respective output voltages $E_0$ and $E_{0a}$ can be adjusted over three decimal digits, the composite output from the synthesizing circuit 83 could be adjusted over six digits in the decimal system. Therefore, the synthesizing ratio of the synthesizing circuit 83 is determined in accordance with the number of digits over which the change-over ratios of the switches 21 and 21a should be adjusted. Thus, the output from the code signal generator $A_0$ can be adjusted over, in this case, as many as six digits in the decimal system. Furthermore, such a three-digit adjustment is sufficient for the change-over ratio of each of the switches 21 and 21a. In this case, even if the resistance values of the resistors 84 and 85 are not exactly in agreement with the above-mentioned ratios, it is possible to obtain a correct code signal output by the adjustment of the set values of the setting circuits 26 and 26a, which is effected by the aforesaid calibration using the reference value or the voltmeter. It is sufficient to perform such an accurate adjustment with the synthesizing circuit 83 only for the code signal generator outputs corresponding to the higher order bits of the input digital signals.

It will be apparent that many modifications and variations may be effected without departing from the scope of the novel concepts of this invention.

What is claimed is:

1. A digital-to-analog converter operatively connected to receive a digital input signal and a reference voltage, comprising:
   code signal generators, each of which comprises:
      setting means for generating a set value;
      control means, operatively connected to said setting means, for generating a control signal having a duty ratio corresponding to said set value;
      switching means, operatively connected to said control means, for selectively connecting the reference voltage at a first node in dependence upon said control signal, so that a square wave voltage signal is generated;
   a smoothing circuit, operatively connected at said first node, for smoothing said square wave voltage signal having the duty ratio corresponding to said set value, said code signal generators corresponding to respective bits of the digital input signal to be converted, said set value being selected so that the one of said code signal generators corresponding thereto will produce a bit analog output corresponding to the weight of the corresponding bit of the digital input signal;
   output switching means, operatively connected to said smoothing circuit of each of said code signal generators, for selectively providing the outputs therefrom in response to the respective bits of the digital input signal;
   summing means, operatively connected to said output switching means, for summing the outputs provided by said output switching means to obtain an analog output signal; and
   means for calibrating each of said code signal generators, comprising:
      a reference value generator for generating a reference value, for each of said code signal generators, corresponding to the analog output signal which is produced when only one of said code signal generators is connected to said summing means by said output switching means;

a comparator, having inputs operatively connected to said summing means and to said reference value generator, for comparing the analog output signal, comprising the output provided by a selected one of said code signal generators, with the corresponding reference value from said reference value generator; and a controller, operatively connected to said comparator, said reference value generator and said plurality of code signal generators, for altering the set value generated by said setting means, of the selected one of said code signal generators, in dependence upon the comparison result, so that the inputs to said comparator become equal.

2. A digital-to-analog converter operatively connected to receive a digital input signal, comprising:

a reference voltage source for generating a reference voltage;

a plurality of code signal generators, each comprising:

setting means for generating a set value;

a control circuit, operatively connected to said setting means, for receiving the set value and for generating a control signal having a duty ratio corresponding to the set value;

a change-over switch, operatively connected to said control circuit and said reference voltage source, for selectively connecting said reference voltage source or a common potential point in dependence upon said control signal; and a smoothing circuit, operatively connected to said change-over switch, for converting, into DC form, a square wave voltage changing between the reference voltage and the common potential for the duty ratio corresponding to the set value, said plurality of code signal generators corresponding to respective bit positions of a digital input signal to be converted, the set value for each setting means being selected so that the one of said plurality of code signal generators corresponding thereto will produce a DC output corresponding to the weight of the corresponding bit position of the digital input signal;

a plurality of output switches, operatively connected to the outputs of the respective code signal generators, for selectively providing the outputs therefrom in response to the state of the respective bits of the digital input signal;

a summing circuit, operatively connected to said plurality of output switches, for summing the outputs provided by said plurality of output switches to obtain an analog output signal converted from the digital input signal;

a reference value generator for generating a reference value corresponding to the output from each of said plurality of code signal generators;

a comparator, operatively connected to said summing circuit and said reference value generator, for comparing the output from a selected one of said plurality of code signal generators with the corresponding reference value from said reference value generator; and a controller, operatively connected to said comparator, said reference value generator and said plurality of code signal generators, for controlling, in accordance with the comparison result, the set value for the selected one of said plurality of code signal generators so that the inputs to the comparator become equal.

3. A digital-to-analog converter as set forth in claim 2, wherein said digital-to-analog converter is operatively connected to receive clock pulses, and wherein said control circuit comprises:

a counter for repeatedly counting a predetermined number of the clock pulses;

set value detecting means, operatively connected to said counter and said setting means, for detecting when the count value of said counter reaches the set value and for generating a set value signal; and a flip-flop operatively connected to said counter and said set value detecting means, said flip-flop controlled to be set and reset by the set value signal and a signal representing the reference state of the counter, respectively, to provide, as an output, the control signal.

4. A digital-to-analog converter as set forth in claim 2, whwerein said control circuit comprises a flip-flop for providing the control signal, and wherein said digital-to-analog converter is operatively connected to receive clock pulses, further comprising:

a counter, operatively connected to said flip-flop of each of said plurality of code signal generators, for repeatedly counting a predetermined number of the clock pulses and for providing the count content as an address signal; and set value detecting means, operatively connected to said counter and to each of said plurality of code signal generators, for detecting when the count value of said counter reaches the set values and for generating the set value signals;

wherein said set value detecting means comprises:

a read/write memory, operatively connected to receive the count content of the counter as the address signal, for reading out data in accordance with the address signal; and a decoder, operatively connected to said read/write memory and to said flip-flop of each of said plurality of code signal generators, for decoding the data read out from said read/write memory and for generating the set value signals;

wherein the time period for reading out all of the addresses of said read/write memory and the time period for the control signals are brought into agreement with each other to coordinate the addresses of the read/write memory with the duty ratios of the respective control signals and the data representing the one of said plurality of code signal generators corresponding to the control signal is stored in said read/write memory at the corresponding address; and wherein said flip-flop is set by the corresponding set value signal and is reset by a signal representing the corresponding reference state of said counter.

5. A digital-to-analog converter as set forth in claim 2, wherein said reference value generator comprises:

a reference setting circuit, operatively connected to said controller, for setting therein a reference set value representing the reference value to be outputted under the control of said controller;

a reference control circuit, operatively connected to said reference setting circuit, for yielding a reference control signal having a duty ratio corresponding to the reference set value;

a reference change-over switch, operatively connected to said reference control circuit, said reference change-over switch being selectively connected to the reference voltage source and the common potential point under the control of the reference control signal; and a reference smoothing circuit, operatively connected to said reference change-over switch, for smoothing the output of said reference change-over switch to provide the reference value corresponding to the selected one of said plurality of code signal generators.

6. A digital-to-analog converter as set forth in claim 3, wherein said set value detecting means comprises a set value counter for counting the clock pulses and for detecting that the set value has been reached when a carry output or a cancelling output is generated and wherein the set value is preset by the signal representing the reference state of the set value counter.

7. A digital-to-analog converter as set forth in claim 4, further comprising:

means for writing data representing the reference value into said read/write memory at an address corresponding to the duty ratio of the control signal in an ideal state of a selected one of said plurality of code signal generators;

a reference flip-flop, having an output operatively connected to said decoder, set by the decoded output from said decoder which decodes the data representing the reference value, and reset by a signal representing the reference state of said counter;

a reference change-over switch, operatively connected to said reference flip-flop, controlled by the output of said reference flip-flop to be selectively connected to said reference voltage source or the common potential point;

a reference smoothing circuit, operatively connected to said reference change-over switch, for smoothing the output from said reference change-over switch;

a comparator, having inputs operatively connected to said reference smoothing circuit and the selected one of said plurality of code signal generators, for comparing the output of said reference smoothing circuit with the output from the selected one of said plurality of code signal generators; and means for changing, in accordance with the comparison result, the address for writing the data representing the selected one of said plurality of code signal generators so that the inputs of said comparator will be equal.

8. A digital-to-analog converter as set forth in claim 2, 3, 6, 4, 7 or 5, wherein a high order bit converter for converting high order bits of the digital input signal into a high order analog signal is formed by said plurality of code signal generators, said output switches and said summing circuit, and wherein said digital-to-analog converter further comprises a lower order bit converter for converting the lower order bits of the digital input signal into low order analog signals weighted by resistance circuits, and summing means, operatively connected to said summing circuit and said low order bit converter, for summing the high order analog signal and the low order analog signals to obtain the analog output signal.

9. A digital-to-analog converter as set forth in claim 2, 3, 6, 4, 7 or 5, wherein a high order bit converter, for converting high order bits of the digital input signal into a high order analog signal, is formed by said plurality of code signal generators, said output switches and said summing circuit, wherein said digital-to-analog converter further comprises a low order bit converter, operatively connected to said summing circuit, for converting the low order bits of the digital input signal into low order signals weighted by resistance circuits, and wherein said summing circuit sums the high order analog signal and the low order analog signals to obtain the analog output signal.

10. A digital-to-analog converter as set forth in claim 2, 3, 6, 4, 7 or 5, wherein each of said plurality of code signal generators further comprises a voltage-current converter, operatively connected between said smoothing circuit and the corresponding one of said output switches, for converting the output of said smoothing circuit into a current, and wherein said summing circuit is a current summing circuit.

11. A digital-to-analog converter as set forth in claim 2, 3, 6, 4, 7 or 5, wherein at least one of said plurality of code signal generators further comprises:

a sub-setting circuit for setting therein a subset value;

a sub-control circuit, operatively connected to said sub-setting circuit, for producing a sub-control signal having a duty ratio determined by said subset value;

a sub-change-over switch, operatively connected to said sub-control circuit and said reference voltage, said sub-change-over switch controlled by said sub-control signal to be selectively connected to said reference voltage source and the common potential point; and a synthesizing circuit, operatively connected to said change-over switch and said sub-change-over switch, for adding the output of said sub-change-over switch to the output of said change-over switch and for supplying a composite output to said smoothing circuit.

* * * * *

UNITED STATES PATENT AND TRADEMARK OFFICE
CERTIFICATE OF CORRECTION

PATENT NO. : 4,369,432
DATED : JANUARY 18, 1983
INVENTOR(S) : TSUKASA MIKAMI

It is certified that error appears in the above-identified patent and that said Letters Patent is hereby corrected as shown below:

```
Front page, insert
            --[30] Foreign Application Priority Data
                   Feb. 13, 1979     Japan ..... 54-15264--.

Col.  1, line 20, after "accuracy" insert --,--.
Col.  4, line 26, change "abovemen-" to --above-men---.

Col.  6, line 33, change "Inare" to --In are--.
Col.  7, line 50, change "ciircuit" to --circuit--.
Col. 10, line 37, change "indentical" to --identical--.
Col. 12, line 12, after "value" insert --,--.
Col. 14, line 61, change "Q" to --Q̄--.
Col. 18, line 21, change "whwerein" to --wherein--.
```

Signed and Sealed this

Eighth Day of November 1983

[SEAL]

Attest:

GERALD J. MOSSINGHOFF

Attesting Officer   Commissioner of Patents and Trademarks